US012655736B2

(12) United States Patent
Cao et al.

(10) Patent No.: US 12,655,736 B2
(45) Date of Patent: Jun. 16, 2026

(54) METHOD FOR PROCESSING OPERATING STATE OF HIGH-PRESSURE MANIFOLD, COMPUTER-READABLE STORAGE MEDIUM AND PROCESSOR

(71) Applicants:SHANDONG REIMAGINATION OIL & GAS EQUIPMENT TECHNOLOGY INNOVATION CENTER, Yantai (CN); YANTAI JEREH OILFIELD SERVICES GROUP CO., LTD., Yantai (CN)

(72) Inventors: Pu Cao, Yantai (CN); Cunheng Chen, Yantai (CN); Xiaowei Yi, Yantai (CN); Jinyu Zhao, Yantai (CN)

(73) Assignees: Shandong Reimagination Oil & Gas Equipment Technology Innovation Center, Yantai (CN); Yantai Jereh Oilfield Services Group Co., Ltd., Yantai (CN)

( * ) Notice: Subject to any disclaimer, the term of this patent is extended or adjusted under 35 U.S.C. 154(b) by 476 days.

(21) Appl. No.: 18/316,058

(22) Filed: May 11, 2023

(65) Prior Publication Data

US 2023/0287780 A1     Sep. 14, 2023

Related U.S. Application Data

(63) Continuation of application No. PCT/CN2022/112428, filed on Aug. 15, 2022.

(30) Foreign Application Priority Data

Jan. 5, 2022    (CN) .......................... 202210009636.7

(51) Int. Cl.
*E21B 43/26*        (2006.01)
*F17D 5/02*         (2006.01)
*G06F 30/18*        (2020.01)

(52) U.S. Cl.
CPC ............ *E21B 43/2607* (2020.05); *F17D 5/02* (2013.01); *G06F 30/18* (2020.01); *E21B 2200/20* (2020.05)

(58) Field of Classification Search
CPC .... E21B 43/2607; E21B 2200/20; F17D 5/02; G06F 30/18; G06F 2113/08;
(Continued)

(56) References Cited

U.S. PATENT DOCUMENTS

2003/0167919 A1    9/2003  Schempf
2004/0148113 A1    7/2004  Sage
(Continued)

FOREIGN PATENT DOCUMENTS

CN        103939749 A      7/2014
CN        108681885 A     10/2018
(Continued)

OTHER PUBLICATIONS

Rejection Decision for Chinese Application No. 202210009636.7 mailed on May 9, 2025.
(Continued)

*Primary Examiner* — Amine Benlagsir
(74) *Attorney, Agent, or Firm* — Sheppard Mullin Richter & Hampton LLP

(57) ABSTRACT

A method for processing an operating state of a high-pressure manifold, includes: determining a connection diagram of the high-pressure manifold, and the connection diagram is a line diagram formed by a plurality of device nodes; obtaining manifold data from a start node to an end node in the line diagram, and the manifold data includes flow parameters of a fluid in the high-pressure manifold; and determining the operating state of the high-pressure manifold according to the manifold data.

15 Claims, 5 Drawing Sheets

(58) Field of Classification Search
CPC ............. G06F 2113/14; G06F 2119/04; G06F 2119/14; G06F 30/20
See application file for complete search history.

(56) References Cited

U.S. PATENT DOCUMENTS

| | | | |
|---|---|---|---|
| 2011/0098946 A1* | 4/2011 | Curtiss, III | ............. E21B 34/16 702/50 |
| 2016/0194942 A1* | 7/2016 | Wiegman | ................ F04B 17/03 166/250.15 |
| 2018/0045196 A1* | 2/2018 | Rampen | ................... F04B 49/12 |
| 2018/0045331 A1* | 2/2018 | Lopez | ...................... F17D 3/01 |
| 2021/0156878 A1* | 5/2021 | Derman | ............. G01N 35/1009 |

FOREIGN PATENT DOCUMENTS

| | | | | |
|---|---|---|---|---|
| CN | 110334477 | A | * 10/2019 | ............. G06F 30/18 |
| CN | 111609890 | A | * 9/2020 | ............. F17D 5/00 |
| CN | 113408085 | A | 9/2021 | |
| CN | 113822577 | A | * 12/2021 | ............. G06Q 50/02 |
| CN | 114357679 | A | 4/2022 | |
| WO | 2014083340 | A1 | 6/2014 | |

OTHER PUBLICATIONS

Second Office Action for Chinese Application No. 202210009636.7 mailed on Feb. 19, 2025.

International Preliminary Report on Patentability Chapter I for PCT International Application No. PCT/CN2022/112428 mailed on Jul. 18, 2024.

Written Opinion and International Search Report for PCT International Application No. PCT/CN2022/112428 mailed on Oct. 25, 2022.

First Office Action for Chinese Application No. 202210009636.7 mailed on Oct. 21, 2024.

First Office Action for Chinese Application No. 202210009636.7 mailed on Oct. 14, 2024.

* cited by examiner

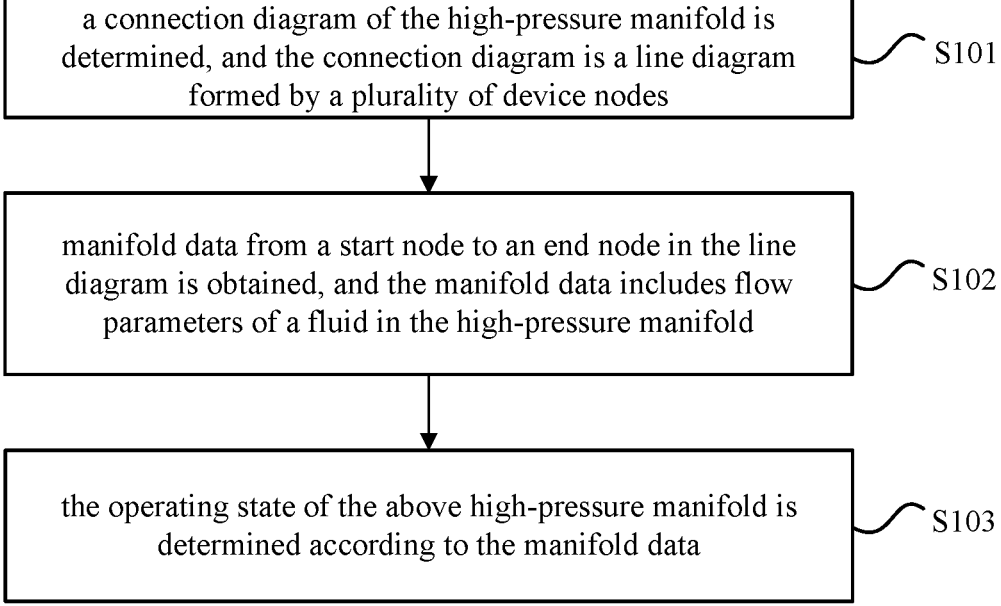

a connection diagram of the high-pressure manifold is determined, and the connection diagram is a line diagram formed by a plurality of device nodes — S101 manifold data from a start node to an end node in the line diagram is obtained, and the manifold data includes flow parameters of a fluid in the high-pressure manifold — S102 the operating state of the above high-pressure manifold is determined according to the manifold data — S103

FIG. 1

METHOD FOR PROCESSING OPERATING STATE OF HIGH-PRESSURE MANIFOLD, COMPUTER-READABLE STORAGE MEDIUM AND PROCESSOR

CROSS-REFERENCE TO RELATED APPLICATION

This application is a continuation application of International Patent Application No. PCT/CN2022/112428 filed Aug. 15, 2022, which claims priority to Chinese patent application No. 202210009636.7, filed with the China National Intellectual Property Administration on Jan. 5, 2022. The content of all of the above-referenced applications is incorporated herein by reference in their entirety.

TECHNICAL FIELD

The disclosure relates to the technical field of high-pressure manifolds, in particular to a method for processing an operating state of a high-pressure manifold, a computer-readable storage medium and a processor.

BACKGROUND

High-pressure manifold is the general name of a series of pipes bearing high pressure in oil and gas fracturing industry. An oil and gas fracturing device injects fracturing fluids mixed with chemical substances into rock strata by means of high-pressure manifolds for hydraulic fracturing, so as to release oil and gas. There is a wide variety of high-pressure manifolds, which include movable elbows, tee joints, straight pipes, plug valves, throttle valves, integral joints, movable joints, etc, and the parameters of the fracturing fluid such as a sand-fluid ratio, a flow rate, a flow velocity and a pressure may be changed according to site conditions. Different types of manifolds have different service lives in different operating environments, and accidents often occur due to failure to timely replace them after the end of their service lives.

At present, there are mainly two solutions for use condition and safety inspection of high-pressure manifolds:

1. Manual recording and inspection. However, manual recording and marking are difficult due to large quantity and various types of the manifolds, and interiors of the manifolds cannot be observed due to complex structures of them. Moreover, in high-pressure operation, potential safety hazards become safety accidents within a few seconds, so manual inspection before operation has little effect on system preventing break down due to manifold failures.

2. Manifold data collection by added sensors. However, it is extremely difficult to mount sensors and receive and send signals, especially for produced manifolds. In addition, cost is tremendous if sensors are added on all of the huge quantity of manifolds. Therefore, in a method known to the inventors, sensors are mainly added on large manifolds, but accidents often occur on small manifolds, such that this solution also produces little effect on preventing system break down due to manifold failures.

In view of the above problems, no effective solution has been proposed yet.

SUMMARY

Embodiments of the disclosure provide a method for processing an operating state of a high-pressure manifold, a computer-readable storage medium and a processor.

An aspect of embodiments of the disclosure provides a method for processing an operating state of a high-pressure manifold. The method includes: a connection diagram of the high-pressure manifold is determined, and the connection diagram is a line diagram formed by a plurality of device nodes; manifold data from a start node to an end node in the line diagram is obtained, and the manifold data includes flow parameters of a fluid in the high-pressure manifold; and the operating state of the high-pressure manifold is determined according to the manifold data.

In some embodiments, the connection diagram of the high-pressure manifold is determined includes: the plurality of device nodes are obtained; setting rules of the device nodes are determined; and the plurality of device nodes are processed according to the setting rules to generate the connection diagram of the high-pressure manifold.

In some embodiments, the device nodes include at least one type of the following devices: fracturing devices, high-pressure manifolds, or wellheads; and the setting rules includes at least one of the following rules that the fracturing device is configured as the start node in the line diagram; the wellhead is configured as the end node in the line diagram; or the high-pressure manifolds at least include a common high-pressure manifold, a high-pressure confluence skid and a high-pressure diversion skid, and the common high-pressure manifold is configured as an intermediate node in the line diagram, the high-pressure confluence skid is configured as the start node or the end node in the line diagram, and the high-pressure diversion skid is configured as the start node or the end node in the line diagram.

In some embodiments, the manifold data from the start node to the end node in the line diagram is obtained includes: connection types of the line diagram are determined, and the connection types includes at least one of the following types: single-source direct connection, single-source diversion, and/or multi-source confluence; and the manifold data from the start node to the end node in the line diagram is computed according to the connection types.

In some embodiments, the manifold data from the start node to the end node in the line diagram is obtained includes: the manifold data from the start node to the end node in the line diagram is obtained according to a preset time period.

In some embodiments, the operating state of the high-pressure manifold is determined according to the manifold data in the situation where the operating state includes a health state includes:

item scores of a plurality of dimensions are computed according to the manifold data, and the item scores at least include: a cumulative service time score, a cumulative flow rate score, a cumulative pressure score, and a flow velocity and sand quantity score;

weights corresponding to the item scores are determined; and the health state of the high-pressure manifold is determined according to the item scores of the plurality of dimensions and the weights corresponding to the item scores.

In some embodiments, the operating state of the high-pressure manifold is determined according to the manifold data in the situation where the operating state includes a remaining life includes: working parameters of the high-pressure manifold are computed according to the manifold data, and the working parameters include: a working duration, a working flow rate, a working sand quantity, a coefficient corresponding to a working pressure, and a coefficient corresponding to a working flow velocity; threshold parameters of the high-pressure manifold are determined, and the threshold parameters at least include: a service time threshold, a flow rate threshold and a sand quantity threshold; and determining the remaining life of the high-pressure manifold according to the working parameters and the threshold parameters.

Still another aspect of embodiments of the disclosure further provides a non-transitory computer-readable storage medium. The computer-readable storage medium includes a stored program, and the program controls a device where the computer-readable storage medium is located to execute any one of the above methods for processing an operating state of a high-pressure manifold.

Still another aspect of embodiments of the disclosure further provides a processor. The processor is configured to run a program to execute any one of the above methods for processing an operating state of a high-pressure manifold.

BRIEF DESCRIPTION OF THE DRAWINGS

The accompanying drawings described herein serve to provide a further understanding of the disclosure and form a part hereof, and the illustrative embodiments of the disclosure and the description of the illustrative embodiments serve to explain the disclosure and are not to be construed as unduly limiting the disclosure. In the accompanying drawings:

FIG. 1 is a flowchart of a method for processing an operating state of a high-pressure manifold according to embodiments of the disclosure;

DETAILED DESCRIPTION OF THE EMBODIMENTS

Figure 2:
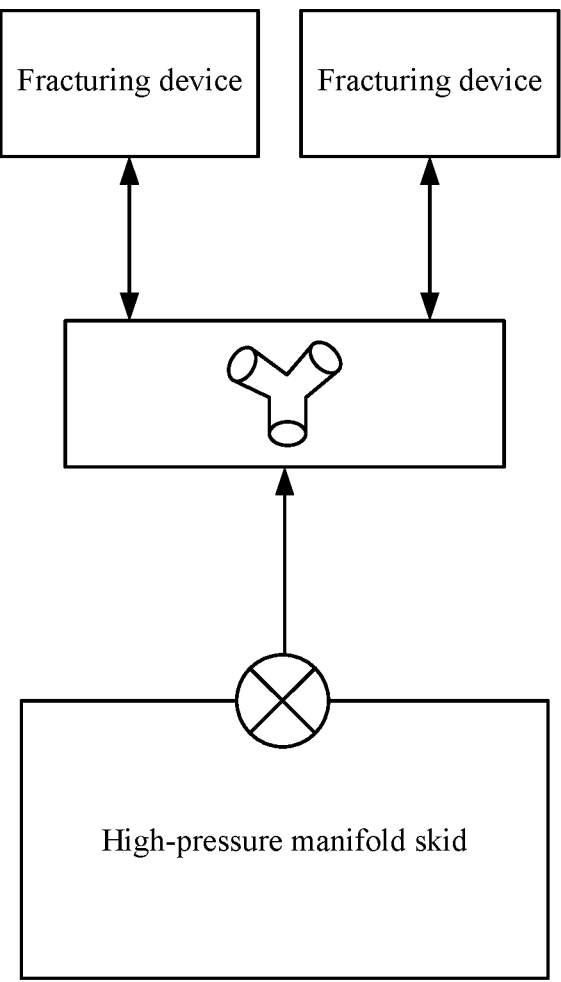
FIG. 2 is a schematic diagram showing connections between a high-pressure manifold and a fracturing device according to embodiments of the disclosure.

In order to enable those skilled in the art to better understand the solutions of the disclosure, the technical solutions in the embodiments of the disclosure will be described below clearly and comprehensively in conjunction with the accompanying drawings in the embodiments of the disclosure. Apparently, the embodiments described are merely some of rather than all embodiments. On the basis of the embodiments of the disclosure, all other embodiments obtained by those of ordinary skill in the art without making inventive efforts should all fall within the protection scope of the disclosure.

It should be noted that the terms "first", "second" and so forth, in the description and claims of the disclosure and in the above accompanying drawings, are used to distinguish between similar objects and not necessarily to describe a particular order or sequential order. It should be understood that data used in this way can be interchanged under appropriate circumstances such that the embodiments of the disclosure described herein can be implemented in a sequence other than those illustrated or described herein. Moreover, the terms "include" and "have" as well as any variations thereof are intended to mean covered and non-exclusive inclusion, for example, a process, a method, a system, a product or a device including a series of steps or units is not required to be limited by those explicitly listed, but can include other steps or units not explicitly listed or inherent to the process, method, product or device.

As described in the background art, there are technical problems of high cost and poor effect of inspecting an operating state of a high-pressure manifold through manual recording and inspection or by adding sensors in the related art. In order to solve the above problems, typical embodiments of the disclosure provide a method for processing an operating state of a high-pressure manifold, a computer-readable storage medium, and a processor.

Embodiments of the disclosure provides a method for processing an operating state of a high-pressure manifold. It should be noted that steps illustrated in the flow charts of the accompanying drawings can be executed in a computer system such as a set of computer-executable instructions, and although a logical order is illustrated in the flow diagrams, in some situations, the steps shown or described can be executed in an order different from that herein.

FIG. 1 is a flowchart of a method for processing an operating state of a high-pressure manifold according to embodiments of the disclosure. As shown in FIG. 1, the method includes the following steps:

step S101: a connection diagram of the high-pressure manifold is determined, and the above connection diagram may be a line diagram formed by a plurality of device nodes;

step S102: manifold data from a start node to an end node in the above line diagram is obtained, and the above manifold data includes flow parameters of a fluid in the above high-pressure manifold and;

step S103: the operating state of the above high-pressure manifold is determined according to the above manifold data.

According to the above method for processing an operating state of a high-pressure manifold, firstly, the connection diagram of the high-pressure manifold is determined, and the above connection diagram may be the line diagram formed by the plurality of device nodes; secondly, the manifold data from the start node to the end node of the above line diagram is obtained, the above manifold data include the flow parameters of the fluid in the above high-pressure manifold; and thirdly, the operating state of the above high-pressure manifold is determined according to the above manifold data. According to the method, the operating state of the above high-pressure manifold is determined according to the connection diagram of the high-pressure manifold and the manifold data from the start node to the end node in the line diagram, such that a manifold having a poor operating state may be emphatically identified, inspected and timely replaced, accidents are effectively avoided, and then the technical problems of high cost and poor effect of inspecting an operating state of a high-pressure manifold through manual recording and inspection or by adding sensors in the related art are solved.

In some embodiments of the disclosure, the step of the connection diagram of the high-pressure manifold being determined includes: the plurality of device nodes are obtained; setting rules of the above device nodes are determined; and the above plurality of device nodes are processed according to the setting rules to generate the connection diagram of the above high-pressure manifold. The connection diagram of the high-pressure manifold generated by the nodes and the setting rules thereof is clearer and more accurate, and subsequently, working parameters of the high-pressure manifold may be conveniently computed.

In some embodiments, the connection diagram of the above high-pressure manifold is constructed in advance according to actual connection conditions of production and operation sites. The connection diagram may be stored in the system in the form of data and pictures. Various parameters, such as mounting types and models of the high-pressure manifold may be manually entered into the system in advance.

In some other embodiments of the disclosure, the device nodes include at least one type of the following devices: fracturing devices, high-pressure manifolds, and wellheads; and the setting rules includes at least one of the following rules: that the above fracturing device is configured as the start node in the line diagram; the above wellhead is configured as the end node in the line diagram; and the above high-pressure manifolds at least include a common high-pressure manifold, a high-pressure confluence skid and a high-pressure diversion skid, and the above common high-pressure manifold is configured as an intermediate node in the line diagram, the above high-pressure confluence skid is configured as the start node or the end node in the line diagram, and the high-pressure diversion skid is configured as the start node or the end node in the line diagram.

Figure 3:
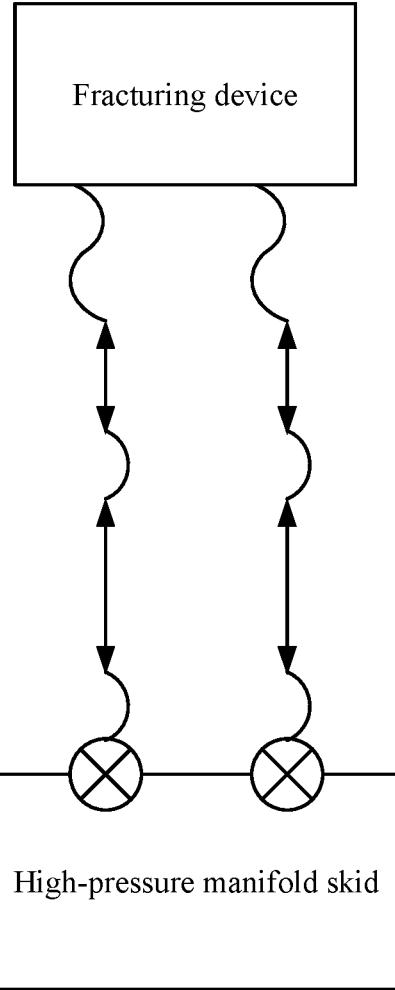
FIG. 3 is a schematic diagram showing connections between a high-pressure manifold and a fracturing device according to embodiments of the disclosure.

In some embodiments, a plurality of nodes form one line, nodes at two ends of the line are referred to as a start node and an end node, and a plurality of lines together form a connection diagram. Types of lines include: sequentially disposing a device, a common high-pressure manifold 1, a common high-pressure manifold 2, . . . , a common high-pressure manifold n, and a high-pressure confluence skid; sequentially disposing a high-pressure confluence skid, a common high-pressure manifold 1, a common high-pressure manifold 2, . . . , a common high-pressure manifold n, and a high-pressure confluence skid; sequentially disposing a high-pressure confluence skid, a common high-pressure manifold 1, a common high-pressure manifold 2, . . . , a common high-pressure manifold n, and a high-pressure diversion skid; sequentially disposing a device, a common high-pressure manifold 1, a common high-pressure manifold 2, . . . , a common high-pressure manifold n, and a high-pressure diversion skid; sequentially disposing a high-pressure diversion skid, a common high-pressure manifold 1, a common high-pressure manifold 2, . . . , a common high-pressure manifold n, and a wellhead. In some embodiments, as shown in FIG. 2, a plurality of fracturing devices are allowed to be connected to the same high-pressure confluence skid by means of manifolds such as a tee joint and a cross joint, and in this way, each fracturing device is regarded as a line with the same end node. As shown in FIG. 3, one fracturing device is allowed to be connected to a high-pressure confluence skid by means of a plurality of outlets, and in this way, each outlet is regarded as a line with the same start node. In addition, the above fracturing device is provided with a plurality of sensors, such that an operation condition of each component of the device may be detected in real time, and real-time data is transmitted to the system by a network through a device gateway.

In an embodiment of the disclosure, before the connection diagram of the above high-pressure manifold is determined, the fracturing device, high-pressure manifold and wellhead information is entered into the system. Radio frequency identification (RFID) tags are made for fracturing devices and high-pressure manifolds, and tag information is bound with the device and manifold information in the system, such that information of the devices or manifolds may be obtained by scanning the RFID tags. In some embodiments, the steps of determining a connection diagram of the high-pressure manifold are as follows: open a handheld mobile terminal, and select a site for construction; construct a new line; scan RFID tags of devices and manifolds by the handheld mobile terminal according to setting rules of the connection diagram, and add the scanned devices and manifolds to the line in the form of nodes; inspect whether each node on the line is correct and storing the connections; repeat the above two steps until lines are added. In some embodiments, wellhead nodes are manually added. The whole connection diagram is saved, and data is uploaded to the system to determine the connection diagram of the high-pressure manifold.

In order to accurately compute the above manifold data, in still some other embodiments of the disclosure, the step of the manifold data from the start node to the end node in the line diagram being obtained includes: connection types of the above line diagram are determined, and the connection type includes at least one of the following types: single-source direct connection, single-source diversion and multi-source confluence; or the manifold data from the start node to the end node in the line diagram is computed according to the connection types.

Figure 4:
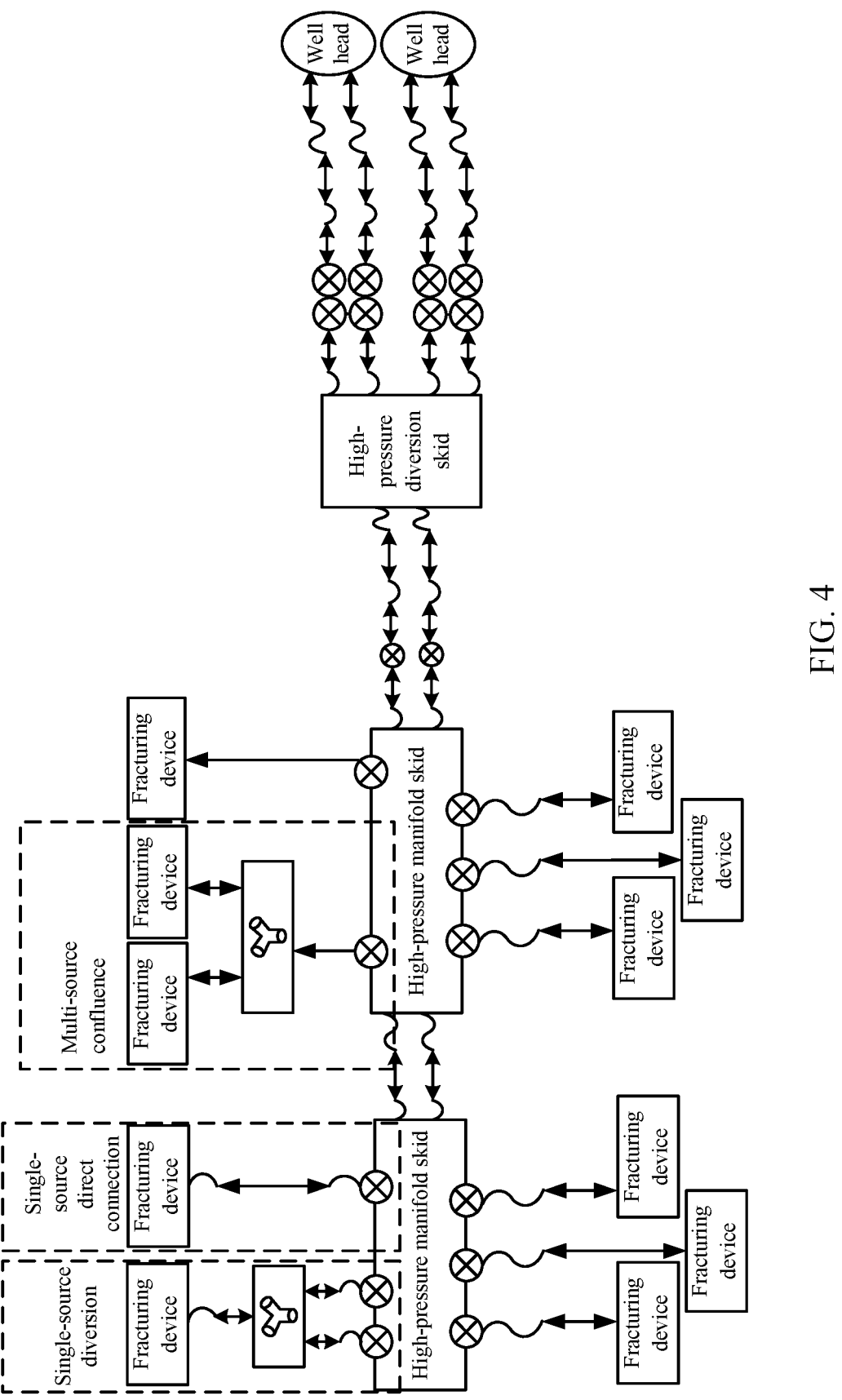
FIG. 4 is a diagram of a high-pressure manifold according to embodiments of the disclosure.

In some embodiments, as shown in FIG. 4, for manifold data of a line with a fracturing device as a start node, when the above single-source direct connection, manifold data from a start node to an end node is sequentially computed. The computation formulas are as follows: flow rate=flow rate of previous node, sand quantity=sand quantity of previous node, pressure=pressure of previous node, flow velocity of device node=flow rate/(inner diameter of pipe×inner diameter of pipe×π÷4), and flow velocity of other nodes=flow velocity of previous node×(inner diameter of current node/inner diameter of previous node)^2. When the above single-source diversion, manifold data from a start node to a diversion node is sequentially computed, and then in each diversion line, manifold data from the diversion node to an end node is sequentially computed. The computation formulas for a next node of the diversion node are as follows: flow rate=flow rate of previous node×cross-sectional area/total cross-sectional area, sand quantity=sand quantity of previous node×cross-sectional area/total cross-sectional area, pressure=pressure of previous node=flow velocity of previous node×(inner diameter of current node/inner diameter of previous node)^2, and flow velocity=flow rate/(inner diameter of pipe×inner diameter of pipe×π÷4). The computation formulas for other nodes are as follows: flow rate=flow rate of previous node, sand quantity=sand quantity of previous node, pressure=pressure of previous node, flow velocity of device node=flow rate/(inner diameter of pipe×inner diameter of pipe×π÷4), and flow velocity of other nodes=flow velocity of previous node×(inner diameter of current node/inner diameter of previous node)^2. When the above multi-source confluence, manifold data from a plurality of start nodes to a confluence node is sequentially computed, and then manifold data from the confluence node to an end node is computed. The computation formulas for the confluence node are as follows: flow rate=sum of flow rate of a plurality of previous nodes, sand quantity=sum of sand quantity of a plurality of previous nodes, pressure=sum of a plurality of (pressure of previous node×flow rate)/flow rate, and flow velocity=flow rate/(inner diameter of pipe× inner diameter of pipe×π÷4). Computation formulas for other nodes are as follows: flow rate=flow rate of previous node, sand quantity=sand quantity of previous node, pressure=pressure of previous node, flow velocity of device node=flow velocity/(inner diameter of pipe×inner diameter of pipe×π÷4), flow velocity of other nodes=flow velocity of previous node×(inner diameter of current node/inner diameter of previous node)^2.

In some embodiments, as shown in FIG. 4, manifold data of a line with a high-pressure confluence skid as a start node is computed by sequentially traversing high-pressure confluence skids. Whether lines with this high-pressure confluence skid as an end node have been computed is determined first; if yes, the manifold data is computed; and if not, the high-pressure confluence skid is ignored. The computation formulas for manifold data of each manifold skid are as follows: flow rate=sum of flow rate of previous node of line with this manifold skid as end node, sand quantity=sum of sand quantity of line with this manifold skid as end node, pressure=sum of a plurality of (pressure of line with this manifold skid as end node×flow rate)/flow rate, flow velocity=flow rate/(inner diameter of pipe×inner diameter of pipe×π÷4). Then manifold data of a line with this high-pressure confluence skid as a start node is computed, if there is only one line, computation is carried out according to manifold data of the above single-source direct connection line, and if there are a plurality of lines, computation is carried out according to manifold data of the above single-source diversion line. Finally, computation is repeated until computation is carried out on manifold skids. In addition, a method for computing manifold data of a line with a high-pressure diversion skid as a start node is consistent with a method for computing manifold data of a line with the above high-pressure confluence skid as a start node.

In still some other embodiments of the disclosure, the step of the manifold data from the start node to the end node in the line diagram is obtained includes: the manifold data from the start node to the end node in the line diagram is obtained according to a preset time period. The above preset time period may be set to be 10 min for example, and by obtaining the manifold data from the start node to the end node in the line diagram according to the preset time period, timeliness of the manifold data may be improved.

In order to quantitatively describe a health state of the above high-pressure manifold, in still some other embodiments of the disclosure, when the operating state includes the health state of the high-pressure manifold, the step of the above operating state of the high-pressure manifold being determined according to the manifold data may include: item scores of a plurality of dimensions are computed according to the manifold data, and the item scores include at least one of: a cumulative service time score, a cumulative flow rate score, a cumulative pressure score, and/or a flow velocity and sand quantity score; weights corresponding to the item scores are determined; and the health state of the high-pressure manifold is determined according to the item scores of the plurality of dimensions and the weights corresponding to the item scores.

In some embodiments, the computation formula for a total score of the health state of the above high-pressure manifold is: total score=(item score 1×weight)+(item score 2×weight)+(item score . . . ×weight). In the above item scores, a plurality of time intervals may be set for the above cumulative service time score, and a certain score is set for each interval, or linear scoring is carried out in the interval. For example, a score of an interval of 0 h~200 h is 100; a score of an interval of 200 h~500 h is 100~0, which is linearly reduced, and score=100−(service time−200)/(500−200)×100; and a score of an interval of 500 h or above is 0. A plurality of flow rate intervals may be set for the above cumulative flow rate score, and a certain score is set for each interval, or linear scoring is carried out in the interval. For example, a score of an interval of 0 h-20000 h is 100; a score of an interval of 20000 h~50000 h is 100~0, which is linearly reduced, and score=100−(flow rate−20000)/(50000−20000)×100; and a score of an interval of 50000 h or above is 0. A standard pressure, pressure duration and a computation coefficient may be set for the above cumulative pressure score, for example, 100 Mpa, 20 h and 2. The computation formula for the score=100−(working pressure−standard pressure)/standard pressure×(working duration/pressure duration)×computation coefficient×100, if a computed score is less than 0, the score is 0, and if the working pressure is less than the standard pressure, the working pressure is ignored in computation. Calculation examples: in the cases of working pressure 120 Mpa and 10 h; and 150 Mpa and 5 h, score=100-(120−100)/100×(10/20)×2×100−(150−100)/100×(5/20)×2×100=55; and in the cases of working pressure 150 Mpa and 20 h, score=100−(150−100)/100×(20/20)×2×100=0. A sand quantity threshold, a standard flow velocity and a computation coefficient may be set for the above flow velocity and sand quantity score, for example, 10000 cubic meters, 10 cubic meters per second, and 1. The computation formula for the score=100−(working sand quantity×flow velocity/standard flow velocity−sand quantity threshold)/sand quantity threshold×computation coefficient×100, if a computed score is less than 0, the score is 0, and if a computed score is greater than 100, the score is 100. Computation examples: in the cases of sand quantity 5000 cubic meters and 15 cubic meters per second; and 5000 cubic meters and 20 cubic meters per second, score=100−(5000×15/10+5000×20/10−10000)/10000×1×100=25; and in the cases of sand quantity 10000 cubic meters and 20 cubic meters per second, score=100-(10000×20/10−10000)/10000×1×100=0.

In order to quantitatively describe the service life of the above high-pressure manifold, in still some other embodiments of the disclosure, when the operating state includes a remaining life of the high-pressure manifold, the step of the operating state of the high-pressure manifold being determined according to the manifold data may include: working parameters of the high-pressure manifold are computed according to the manifold data, and the working parameters include at least one of: a working duration, a working flow rate, a working sand quantity, a coefficient corresponding to a working pressure, and/or a coefficient corresponding to a working flow velocity; threshold parameters of the high-pressure manifold are determined, and the threshold parameters include at least one of: a service time threshold, a flow rate threshold, and/or a sand quantity threshold; and determine the remaining life of the high-pressure manifold according to the working parameters and the threshold parameters.

In some embodiments, the coefficient corresponding to the above working pressure may be set as follows: a coefficient is 1 in the case that a pressure is 0 Mpa~100 Mpa; a coefficient is 1.2 in the case that a pressure is 100 Mpa~150 Mpa; and a coefficient is 2 in the case that a pressure is 150 MPa~200 MPa. The computation formula for a remaining life is as follows: service life (%)=(working duration 1×working flow rate 1×working sand quantity 1×coefficient corresponding to working pressure 1×coefficient corresponding to working flow rate velocity 1+working duration 2× working flow rate 2×working sand quantity 2×coefficient corresponding to working pressure 2×coefficient corresponding to working flow velocity 2+working duration n×working flow rate n×working sand quantity n×coefficient corresponding to working pressure n×coefficient corresponding to working flow velocity n)/(service time threshold×flow rate threshold×sand quantity threshold).

In some embodiments, manifold data of a previous day may be summarized and processed at half-hour (or set other duration) intervals before 0 o'clock every day, and flow rates, sand quantity, pressures and flow velocities averaged.

Embodiments of the disclosure further provides an apparatus for processing an operating state of a high-pressure manifold, and it should be noted that the apparatus for processing an operating state of a high-pressure manifold in embodiments of the disclosure can be used for executing the method for processing an operating state of a high-pressure manifold provided in embodiments of the disclosure. The apparatus for processing an operating state of a high-pressure manifold provided in embodiments of the disclosure will be introduced below.

Figure 5:
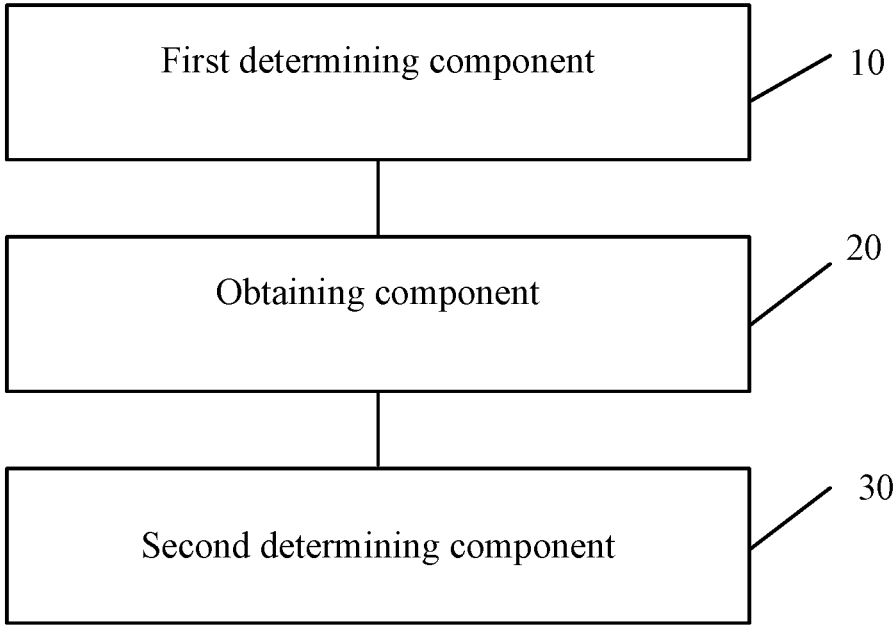
FIG. 5 is a schematic diagram of an apparatus for processing an operating state of a high-pressure manifold according to embodiments of the disclosure.

FIG. 5 is a schematic diagram of an apparatus for processing an operating state of a high-pressure manifold according to embodiments of the disclosure. As shown in FIG. 5, the apparatus includes:

a first determining component 10 configured to determine a connection diagram of the high-pressure manifold, and the above connection diagram is a line diagram formed by a plurality of device nodes;

an obtaining component 20 configured to obtain manifold data from a start node to an end node in the above line diagram, and the above manifold data includes flow parameters of a fluid in the above high-pressure manifold; and a second determining component 30 configured to determine the operating state of the above high-pressure manifold according to the above manifold data.

According to the apparatus for processing an operating state of a high-pressure manifold, firstly, the connection diagram of the high-pressure manifold is determined by the first determining component 10, the above connection diagram being the line diagram formed by the plurality of device nodes; secondly, the manifold data from the start node to the end node of the above line diagram is obtained by the obtaining component 20, the above manifold data being the flow parameters of the fluid in the above high-pressure manifold; and thirdly, the operating state of the above high-pressure manifold is determined by the second determining component 30 according to the above manifold data. According to the apparatus, the operating state of the above high-pressure manifold is determined according to the connection diagram of the high-pressure manifold and the manifold data from the start node to the end node in the line diagram, such that a manifold having a poor operating state may be emphatically identified, inspected, and timely replaced, accidents are effectively avoided, and then the technical problems of high cost and poor effect of inspecting an operating state of a high-pressure manifold through manual recording and inspection or by adding sensors in the related art are solved.

In some embodiments of the disclosure, the above first determining component includes a first obtaining sub-component, a first determining sub-component and a processing sub-component. The above first obtaining sub-component is configured to obtain the plurality of device nodes; the above first determining sub-component is configured to determine setting rules of the device nodes; and the processing sub-component is configured to process the plurality of device nodes according to the setting rules to generate the connection diagram of the high-pressure manifold. The connection diagram of the high-pressure manifold generated by the nodes and the setting rules thereof is clearer and more accurate, and subsequently, working parameters of the high-pressure manifold may be conveniently computed.

In some embodiments, the connection diagram of the above high-pressure manifold is constructed in advance according to actual connection conditions of production and operation sites. The connection diagram may be stored in the system in the form of data and pictures. Various parameters, such as mounting types and models of the high-pressure manifold may be manually entered into the system in advance.

In still some other embodiments of the disclosure, the device nodes include at least one type of the following devices: fracturing devices, high-pressure manifolds and wellheads. The above setting rule includes at least one of the following rules that the above fracturing device is configured as the start node in the line diagram; the above wellhead is configured as the end node in the line diagram; and the above high-pressure manifolds at least include a common high-pressure manifold, a high-pressure confluence skid and a high-pressure diversion skid, the above common high-pressure manifold is configured as an intermediate node in the line diagram, the above high-pressure confluence skid is configured as the start node or the end node in the line diagram, and the high-pressure diversion skid is configured as the start node or the end node in the line diagram.

In some embodiments, a plurality of nodes form one line, nodes at two ends of the line are referred to as a start node and an end node, and a plurality of lines together form a connection diagram. Types of lines include: sequentially disposing a device, a common high-pressure manifold 1, a common high-pressure manifold 2, . . . , a common high-pressure manifold n, and a high-pressure confluence skid; sequentially disposing a high-pressure confluence skid, a common high-pressure manifold 1, a common high-pressure manifold 2, . . . , a common high-pressure manifold n, and a high-pressure confluence skid; sequentially disposing a high-pressure confluence skid, a common high-pressure manifold 1, a common high-pressure manifold 2, . . . , a common high-pressure manifold n, and a high-pressure diversion skid; sequentially disposing a device, a common high-pressure manifold 1, a common high-pressure manifold 2, . . . , a common high-pressure manifold n, and a high-pressure diversion skid; sequentially disposing a high-pressure diversion skid, a common high-pressure manifold 1, a common high-pressure manifold 2, . . . , a common high-pressure manifold n, and a wellhead. In some embodiments, as shown in FIG. 2, a plurality of fracturing devices are allowed to be connected to the same high-pressure confluence skid by means of manifolds such as a tee joint and a cross joint, and in this way, each fracturing device is regarded as a line with the same end node. As shown in FIG. 3, one fracturing device is allowed to be connected to a high-pressure confluence skid by means of a plurality of outlets, and in this way, each outlet is regarded as a line with the same start node. In addition, the above fracturing device is provided with a plurality of sensors, such that an operation condition of each component of the device may be detected in real time, and then real-time data is transmitted to the system by a network through a device gateway.

In an embodiment of the disclosure, before the connection diagram of the above high-pressure manifold is determined, the fracturing device, high-pressure manifold and wellhead information is entered into the system. Radio frequency identification (RFID) tags are made for fracturing devices and high-pressure manifolds, and tag information is bound with the device and manifold information in the system, such that subsequently, information of the devices or manifolds may be obtained by scanning the RFID tags. In some embodiments, the steps of determining a connection diagram of the high-pressure manifold are as follows: open a handheld mobile terminal, and select a site for construction; construct a new line; scan RFID tags of devices and manifolds by the handheld mobile terminal according to setting rules of the connection diagram, and add the scanned devices and manifolds to the line in the form of nodes; inspect whether each node on the line is correct and storing the connections; repeat the above two steps until lines are added. In some embodiments, wellhead nodes are manually added. The whole connection diagram is saved, and data is uploaded to the system to determine the connection diagram of the high-pressure manifold.

In order to accurately compute the above manifold data, in still some other embodiments of the disclosure, the above obtaining component includes a second determining sub-component and a first computing sub-component. The above second determining sub-component is configured to determine connection types of the line diagram, the connection types including at least one of the following types: single-source direct connection, single-source diversion and multi-source confluence; or the above first computing sub-component is configured to compute the manifold data from the start node to the end node in the line diagram according to the connection types.

In some embodiments, as shown in FIG. 4, for manifold data of a line with a fracturing device as a start node, when the above single-source direct connection, manifold data from a start node to an end node is sequentially computed. The computation formulas are as follows: flow rate=flow rate of previous node, sand quantity=sand quantity of previous node, pressure=pressure of previous node, flow velocity of device node=flow rate/(inner diameter of pipe×inner diameter of pipe×π÷4), and flow velocity of other nodes=flow velocity of previous node×(inner diameter of current node/inner diameter of previous node)^2. When the above single-source diversion, manifold data from a start node to a diversion node is sequentially computed, and then in each diversion line, manifold data from the diversion node to an end node is sequentially computed. The computation formulas for a next node of the diversion node are as follows: flow rate=flow rate of previous node×cross-sectional area/total cross-sectional area, sand quantity=sand quantity of previous node×cross-sectional area/total cross-sectional area, pressure=pressure of previous node=flow velocity of previous node×(inner diameter of current node/inner diameter of previous node)^2, and flow velocity=flow rate/(inner diameter of pipe×inner diameter of pipe×π÷4). The computation formulas for other nodes are as follows: flow rate=flow rate of previous node, sand quantity=sand quantity of previous node, pressure=pressure of previous node, flow velocity of device node=flow rate/(inner diameter of pipe×inner diameter of pipe×π÷4), and flow velocity of other nodes=flow velocity of previous node×(inner diameter of current node/inner diameter of previous node)^2. When the above multi-source confluence, manifold data from a plurality of start nodes to a confluence node is sequentially computed, and then manifold data from the confluence node to an end node is computed. The computation formulas for the confluence node are as follows: flow rate=sum of flow rate of a plurality of previous nodes, sand quantity=sum of sand quantity of a plurality of previous nodes, pressure=sum of a plurality of (pressure of previous node×flow rate)/flow rate, and flow velocity=flow rate/(inner diameter of pipe× inner diameter of pipe×π÷4). Computation formulas for other nodes are as follows: flow rate=flow rate of previous node, sand quantity=sand quantity of previous node, pressure=pressure of previous node, flow velocity of device node=flow velocity/(inner diameter of pipe×inner diameter of pipe×π÷4), flow velocity of other nodes=flow velocity of previous node×(inner diameter of current node/inner diameter of previous node)^2.

In some embodiments, as shown in FIG. 4, manifold data of a line with a high-pressure confluence skid as a start node is computed by sequentially traversing high-pressure confluence skids. Whether lines with this high-pressure confluence skid as an end node have been computed is determined first; if yes, the manifold data is computed; and if not, the high-pressure confluence skid is ignored. The computation formulas for manifold data of each manifold skid are as follows: flow rate=sum of flow rate of previous node of line with this manifold skid as end node, sand quantity=sum of sand quantity of line with this manifold skid as end node, pressure=sum of a plurality of (pressure of line with this manifold skid as end node×flow rate)/flow rate, flow velocity=flow rate/(inner diameter of pipe×inner diameter of pipe×π÷4). Then manifold data of a line with this high-pressure confluence skid as a start node is computed, if there is only one line, computation is carried out according to manifold data of the above single-source direct connection line, and if there are a plurality of lines, computation is carried out according to manifold data of the above single-source diversion line. Finally, computation is repeated until computation is carried out on manifold skids. In addition, a method for computing manifold data of a line with a high-pressure diversion skid as a start node is consistent with a method for computing manifold data of a line with the above high-pressure confluence skid as a start node.

In still some other embodiments of the disclosure, the above obtaining component includes a second obtaining sub-component. The above second obtaining sub-component is configured to obtain the manifold data from the start node to the end node in the line diagram according to a preset time period. The above preset time period may be set to be 10 min for example, and by obtaining the manifold data from the start node to the end node in the line diagram according to the preset time period, timeliness of the manifold data may be improved.

In order to quantitatively describe a health state of the above high-pressure manifold, in still some other embodiments of the disclosure, the above second determining component includes a second computing sub-component, a third determining sub-component and a fourth determining sub-component. The above second computing sub-component is configured to compute item scores of a plurality of dimensions according to the manifold data when the operating state includes a health state of the high-pressure manifold, the item scores including at least one of: a cumulative service time score, a cumulative flow rate score, a cumulative pressure score, and/or a flow velocity and sand quantity score. The above third determining sub-component is configured to determine weights corresponding to the item scores. The above fourth determining sub-component is configured to determine the health state of the high-pressure manifold according to the item scores of the plurality of dimensions and the weights corresponding to the item scores.

In some embodiments, the computation formula for a total score of the health state of the above high-pressure manifold is: total score=(item score 1×weight)+(item score 2×weight)+(item score . . . ×weight). In the above item scores, a plurality of time intervals may be set for the above cumulative service time score, and a certain score is set for each interval, or linear scoring is carried out in the interval. For example, a score of an interval of 0 h-200 h is 100; a score of an interval of 200 h-500 h is 100–0, which is linearly reduced, and score=100–(service time–200)/(500–200)×100; and a score of an interval of 500 h or above is 0. A plurality of flow rate intervals may be set for the above cumulative flow rate score, and a certain score is set for each interval, or linear scoring is carried out in the interval. For example, a score of an interval of 0 h-20000 h is 100; a score of an interval of 20000 h-50000 h is 100–0, which is linearly reduced, and score=100–(flow rate–20000)/(50000–20000)×100; and a score of an interval of 50000 h or above is 0. A standard pressure, pressure duration and a computation coefficient may be set for the above cumulative pressure score, for example, 100 Mpa, 20 h and 2. The computation formula for the score=100–(working pressure-standard pressure)/standard pressure×(working duration/pressure duration)×computation coefficient×100, if a computed score is less than 0, the score is 0, and if the working pressure is less than the standard pressure, the working pressure is ignored in computation. Calculation examples: in the cases of working pressure 120 Mpa and 10 h; and 150 Mpa and 5 h, score=100–(120–100)/100×(10/20)×2×100–(150–100)/100×(5/20)×2×100=55; and in the cases of working pressure 150 Mpa and 20 h, score=100–(150–100)/100×(20/20)×2×100=0. A sand quantity threshold, a standard flow velocity and a computation coefficient may be set for the above flow velocity and sand quantity score, for example, 10000 cubic meters, 10 cubic meters per second, and 1. The computation formula for the score=100–(working sand quantity×flow velocity/standard flow velocity-sand quantity threshold)/sand quantity threshold×computation coefficient×100, if a computed score is less than 0, the score is 0, and if a computed score is greater than 100, the score is 100. Computation examples: in the cases of sand quantity 5000 cubic meters and 15 cubic meters per second; and 5000 cubic meters and 20 cubic meters per second, score=100–(5000×15/10+5000×20/10–10000)/10000×1×100=25; and in the cases of sand quantity 10000 cubic meters and 20 cubic meters per second, score=100-(10000×20/10–10000)/10000×1×100=0.

In order to quantitatively describe the service life of the above high-pressure manifold, in still some other embodiments of the disclosure, the above second determining component includes a third computing sub-component, a fifth determining sub-component and a sixth determining sub-component. The above third computing sub-component is configured to compute working parameters of the high-pressure manifold according to the manifold data when the operating state includes a remaining life of the high-pressure manifold, the working parameters including at least one of: working duration, a working flow rate, working sand quantity, a coefficient corresponding to a working pressures, and/or a coefficient corresponding to a working flow velocity. The above fifth determining sub-component is configured to determine threshold parameters of the high-pressure manifold, the threshold parameters including at least one of: a service time threshold, a flow rate threshold, and/or a sand quantity threshold. The above sixth determining sub-component is configured to determine the remaining life of the high-pressure manifold according to the working parameters and the threshold parameters.

In some embodiments, the coefficient corresponding to the above working pressure may be set as follows: a coefficient is 1 in the case that a pressure is 0 Mpa~100 Mpa; a coefficient is 1.2 in the case that a pressure is 100 Mpa~150 Mpa; and a coefficient is 2 in the case that a pressure is 150

MPa~200 MPa. The computation formula for a remaining life is as follows: service life (%)=(working duration 1×working flow rate 1×working sand quantity 1×coefficient corresponding to working pressure 1×coefficient corresponding to working flow rate velocity 1+working duration 2×working flow rate 2×working sand quantity 2×coefficient corresponding to working pressure 2×coefficient corresponding to working flow velocity 2+working duration n×working flow rate n×working sand quantity n×coefficient corresponding to working pressure n×coefficient corresponding to working flow velocity n)/(service time threshold×flow rate threshold×sand quantity threshold).

In some embodiments, manifold data of a previous day may be summarized and processed at half-hour (or set other duration) intervals before 0 o'clock every day, and flow rates, sand quantity, pressures and flow velocities averaged.

The above apparatus for processing an operating state of a high-pressure manifold includes a processor and a memory, the above first determining component, obtaining component and second determining component are stored in the memory as program units, and the processor executes the program units stored in the memory to implement corresponding functions.

The processor includes a core, and the core calls corresponding program units in the memory. One or more cores may be arranged, and the technical problems of high cost and poor effect of inspecting an operating state of a high-pressure manifold through manual recording and inspection or by adding sensors in the related art are solved by adjusting core parameters.

The memory may be a volatile memory, a random access memory (RAM) and/or a non-volatile memory, etc., such as a read-only memory (ROM) or a flash RAM, in a computer-readable medium, and the memory includes at least one memory chip.

Embodiments of the disclosure provides a computer-readable storage medium storing a program, and the program implements the above method for processing an operating state of a high-pressure manifold when executed by a processor.

Embodiments of the disclosure provides a processor. The processor is configured to run a program, and the program executes the above method for processing an operating state of a high-pressure manifold when run.

Embodiments of the disclosure provides a device, the device includes a processor, a memory and a program that is stored in the memory and may be run on the processor, and the program implements at least the following steps when run by the processor:

step S101: a connection diagram of the high-pressure manifold is determined, and the above connection diagram is a line diagram formed by a plurality of device nodes;

step S102: manifold data from a start node to an end node in the above line diagram is obtained, and the above manifold data includes flow parameters of a fluid in the above high-pressure manifold and step S103: the operating state of the above high-pressure manifold is determined according to the above manifold data.

The device herein may be a server, a PC (Personal Computer), a PAD, a mobile phone, etc.

The disclosure further provides a computer program product, which is suitable for executing a program initialized to have at least the following method steps when executed on a data processing device:

step S101: a connection diagram of the high-pressure manifold is determined, and the above connection diagram is a line diagram formed by a plurality of device nodes;

step S102: manifold data from a start node to an end node in the above line diagram is obtained, and the above manifold data includes flow parameters of a fluid in the above high-pressure manifold and step S103: the operating state of the above high-pressure manifold is determined according to the above manifold data.

In the above embodiments of the disclosure, the descriptions of various embodiments are emphasized on their respective aspects, and for portions of a certain embodiment that are not described in detail, references can be made to the associated descriptions of other embodiments.

In several embodiments provided in the disclosure, it should be understood that the disclosed technologies can be implemented in other ways. The apparatus embodiment described above is merely illustrative, for example, division of the above units can be division of logical functions, and there can be other actual implementations. For example, a plurality of units or assemblies can be combined or integrated into another system, or some features can be ignored or not executed. As another point, shown or discussed coupling or direct coupling or communication connection between each other can be an indirect coupling or communication connection by means of some interfaces, units or modules, and can be in an electrical or other form.

The above units described as separated components can be physically separated or not, and the components displayed as units can be physical units or not, that is, they can be located at one place or distributed on a plurality of units. Part or all of the units can be selected according to actual requirements to realize the objective of the solution of the embodiment.

In addition, each functional unit in each embodiment of the disclosure can be integrated in one processing unit, or each unit can exist separately and physically, or two or more units can be integrated in one unit. The above integrated units can be implemented in a hardware form and can also be implemented in a form of a software functional unit.

The above integrated unit can be stored in a computer-readable storage medium if implemented in the form of a software functional unit and sold or used as an independent product. On the basis of the understanding, the technical solutions of the disclosure can be embodied in the form of a software product in essence or a part contributing to the related art or all or part of the technical solutions, and the computer software product is stored in a storage medium and includes several instructions for enabling a computer device (which can be a personal computer, a server or a network device, etc.) to implement all or part of the steps of the above methods described in the various embodiments of the disclosure. The foregoing storage medium can be a universal serial bus flash disk, a read-only memory (ROM), a random access memory (RAM), a mobile hard disk, a magnetic disk, an optical disk and other media capable of storing program codes.

What is mentioned above is merely preferred embodiments of the disclosure, and it should be noted that several improvements and modifications can also be made by those of ordinary skill in the art without departing from the principles of the disclosure, which should also be considered to fall within the scope of protection of the disclosure.

16

What is claimed is:

1. A method for processing an operating state of a high-pressure manifold, comprising:

scanning a radio frequency identification (RFID) tag attached to a fracturing device or a high-pressure manifold with a handheld mobile terminal at a construction site;

obtaining a plurality of device nodes comprising a device node representing the fracturing device bound with the RFID tag, the device node representing the high-pressure manifold bound with the RFID tag, or the device node representing a wellhead at the construction site;

determining a connection diagram, wherein the connection diagram is a line diagram formed by the plurality of device nodes;

obtaining manifold data from a start node to an end node in the line diagram, wherein the manifold data comprises flow parameters of a fluid in the high-pressure manifold; and determining the operating state of the high-pressure manifold according to the manifold data, wherein the determining the connection diagram comprises:

determining setting rules of the device nodes; and processing the plurality of device nodes according to the setting rules to generate the connection diagram, wherein the setting rules comprise at least one of:

the fracturing device configured as the start node in the line diagram;

the wellhead configured as the end node in the line diagram;

high-pressure manifold is configured as an intermediate node in the line diagram if the high-pressure manifold is a common high-pressure manifold, the high-pressure manifold is configured as the start node or the end node in the line diagram if the high-pressure manifold is a high-pressure confluence skid, and the high-pressure manifold is configured as the start node or the end node in the line diagram if the high-pressure manifold is a high-pressure diversion skid.

2. The method according to claim 1, wherein the obtaining the manifold data from the start node to the end node in the line diagram comprises:

determining connection types of the line diagram, wherein the connection types comprise at least one of: single-source direct connection, single-source diversion, or multi-source confluence; and computing the manifold data from the start node to the end node in the line diagram according to the connection types.

3. The method according to claim 1, wherein the obtaining the manifold data from the start node to the end node in the line diagram comprises:

obtaining the manifold data from the start node to the end node in the line diagram according to a preset time period.

4. The method according to claim 1, wherein the operating state comprises a health state of the high-pressure manifold, and the determining the operating state of the high-pressure manifold according to the manifold data comprises:

computing item scores of a plurality of dimensions according to the manifold data, wherein the item scores comprise at least one of: a cumulative service time score, a cumulative flow rate score, a cumulative pressure score, or a flow velocity and sand quantity score;

determining weights corresponding to the item scores; and determining the health state of the high-pressure manifold according to the item scores of the plurality of dimensions and the weights corresponding to the item scores.

5. The method according to claim 1, wherein the operating state comprises a remaining life of the high-pressure manifold, and the determining the operating state of the high-pressure manifold according to the manifold data comprises:

computing working parameters of the high-pressure manifold according to the manifold data, wherein the working parameters comprise at least one of: a working duration, a working flow rate, a working sand quantity, a coefficient corresponding to a working pressure, or a coefficient corresponding to a working flow velocity;

determining threshold parameters of the high-pressure manifold, wherein the threshold parameters comprise at least one of: a service time threshold, a flow rate threshold, or a sand quantity threshold; and determining the remaining life of the high-pressure manifold according to the working parameters and the threshold parameters.

6. A non-transitory computer-readable storage medium storing a computer program, wherein the computer program, when executed by one or more processors, causes the one or more processors to perform operations comprising:

scanning a radio frequency identification (RFID) tag attached to a fracturing device or a high-pressure manifold with a handheld mobile terminal at a construction site;

obtaining a plurality of device nodes comprising a device node representing the fracturing device bound with the RFID tag, the device node representing the high-pressure manifold bound with the RFID tag, or the device node representing a wellhead at the construction site;

determining a connection diagram, wherein the connection diagram is a line diagram formed by the plurality of device nodes;

obtaining manifold data from a start node to an end node in the line diagram, wherein the manifold data comprises flow parameters of a fluid in the high-pressure manifold; and determining an operating state of the high-pressure manifold according to the manifold data, wherein the determining the connection diagram comprises:

determining setting rules of the device nodes; and processing the plurality of device nodes according to the setting rules to generate the connection diagram of the high-pressure manifold, wherein the setting rules comprise at least one of:

the fracturing device is configured as the start node in the line diagram;

the wellhead is configured as the end node in the line diagram;

the high-pressure manifold is configured as an intermediate node in the line diagram if the high-pressure manifold is a common high-pressure manifold, the high-pressure manifold is configured as the start node or the end node in the line diagram if the high-pressure manifold is a high-pressure confluence skid, and the high-pressure manifold is configured as the start node or the end node in the line diagram if the high-pressure manifold is a high-pressure diversion skid.

7. The non-transitory computer-readable storage medium according to claim 6, wherein the obtaining the manifold data from the start node to the end node in the line diagram comprises:

determining connection types of the line diagram, wherein the connection types comprise at least one of:

single-source direct connection, single-source diversion, or multi-source confluence; and computing the manifold data from the start node to the end node in the line diagram according to the connection types.

8. The non-transitory computer-readable storage medium according to claim 6, wherein the obtaining the manifold data from the start node to the end node in the line diagram comprises:

obtaining the manifold data from the start node to the end node in the line diagram according to a preset time period.

9. The non-transitory computer-readable storage medium according to claim 6, wherein the operating state comprises a health state of the high-pressure manifold, and the determining the operating state of the high-pressure manifold according to the manifold data comprises:

computing item scores of a plurality of dimensions according to the manifold data, wherein the item scores comprise at least one of: a cumulative service time score, a cumulative flow rate score, a cumulative pressure score, or a flow velocity and sand quantity score;

determining weights corresponding to the item scores; and determining the health state of the high-pressure manifold according to the item scores of the plurality of dimensions and the weights corresponding to the item scores.

10. The non-transitory computer-readable storage medium according to claim 6, wherein the operating state comprises a remaining life of the high-pressure manifold, and the determining the operating state of the high-pressure manifold according to the manifold data comprises:

computing working parameters of the high-pressure manifold according to the manifold data, wherein the working parameters comprise at least one of: a working duration, a working flow rate, a working sand quantity, a coefficient corresponding to a working pressure, or a coefficient corresponding to a working flow velocity;

determining threshold parameters of the high-pressure manifold, wherein the threshold parameters comprise at least one of: a service time threshold, a flow rate threshold, or a sand quantity threshold; and determining the remaining life of the high-pressure manifold according to the working parameters and the threshold parameters.

11. A processor, configured to execute a program to perform operations comprising:

scanning a radio frequency identification (RFID) tag attached to a fracturing device or a high-pressure manifold with a handheld mobile terminal at a construction site;

obtaining a plurality of device nodes comprising a device node representing the fracturing device bound with the RFID tag, the device node representing the high-pressure manifold bound with the RFID tag, or the device node representing a wellhead at the construction site;

determining a connection diagram, wherein the connection diagram is a line diagram formed by the plurality of device nodes;

obtaining manifold data from a start node to an end node in the line diagram, wherein the manifold data comprises flow parameters of a fluid in the high-pressure manifold; and determining an operating state of the high-pressure manifold according to the manifold data, wherein the determining the connection diagram of the high-pressure manifold comprises:

determining setting rules of the device nodes; and processing the plurality of device nodes according to the setting rules to generate the connection diagram, wherein the setting rules comprise at least one of:

the fracturing device configured as the start node in the line diagram;

the wellhead configured as the end node in the line diagram;

high-pressure manifold is configured as an intermediate node in the line diagram if the high-pressure manifold is a common high-pressure manifold, the high-pressure manifold is configured as the start node or the end node in the line diagram if the high-pressure manifold is a high-pressure confluence skid, and the high-pressure manifold is configured as the start node or the end node in the line diagram if the high-pressure manifold is a high-pressure diversion skid.

12. The processor according to claim 11, wherein the obtaining the manifold data from the start node to the end node in the line diagram comprises:

determining connection types of the line diagram, wherein the connection types comprise at least one of: single-source direct connection, single-source diversion, or multi-source confluence; and computing the manifold data from the start node to the end node in the line diagram according to the connection types.

13. The processor according to claim 11, wherein the obtaining the manifold data from the start node to the end node in the line diagram comprises:

obtaining the manifold data from the start node to the end node in the line diagram according to a preset time period.

14. The processor according to claim 11, wherein the operating state comprises a health state of the high-pressure manifold, and the determining the operating state of the high-pressure manifold according to the manifold data comprises:

computing item scores of a plurality of dimensions according to the manifold data, wherein the item scores comprise at least one of: a cumulative service time score, a cumulative flow rate score, a cumulative pressure score, or a flow velocity and sand quantity score;

determining weights corresponding to the item scores; and determining the health state of the high-pressure manifold according to the item scores of the plurality of dimensions and the weights corresponding to the item scores.

15. The processor according to claim 11, wherein the operating state comprises a remaining life of the high-pressure manifold, and the determining the operating state of the high-pressure manifold according to the manifold data comprises:

computing working parameters of the high-pressure manifold according to the manifold data, wherein the working parameters comprise at least one of: a working duration, a working flow rate, a working sand quantity, a coefficient corresponding to a working pressure, or a coefficient corresponding to a working flow velocity;

determining threshold parameters of the high-pressure manifold, wherein the threshold parameters comprise at least one of: a service time threshold, a flow rate threshold, or a sand quantity threshold; and determining the remaining life of the high-pressure manifold according to the working parameters and the threshold parameters.

\* \* \* \* \*